(12) United States Patent
Hahn et al.

(10) Patent No.: US 6,791,074 B2
(45) Date of Patent: Sep. 14, 2004

(54) LIGHT CURTAIN SYSTEM FOR ESTABLISHING A PROTECTIVE LIGHT CURTAIN, TOOL AND SYSTEM FOR PROCESSING OBJECTS AND METHOD FOR LOADING/UNLOADING A TOOL

(75) Inventors: Sven Hahn, Wachau Ot Lomnitz (DE); Michael Lering, Dresden (DE); Mathias Schulz, Dresden (DE)

(73) Assignee: Infineon Technologies SC300 GmbH & Co. KG, Dresden (DE)

( * ) Notice: Subject to any disclaimer, the term of this patent is extended or adjusted under 35 U.S.C. 154(b) by 77 days.

(21) Appl. No.: 10/185,630

(22) Filed: Jun. 28, 2002

(65) Prior Publication Data

US 2003/0005561 A1 Jan. 9, 2003

Related U.S. Application Data

(63) Continuation of application No. PCT/EP00/12967, filed on Dec. 19, 2000.

(30) Foreign Application Priority Data

Dec. 28, 1999 (EP) .......................................... 99126125

(51) Int. Cl.⁷ ................................................ H01J 40/14
(52) U.S. Cl. ................. 250/221; 250/222.1; 250/338.1; 340/555
(58) Field of Search .............................. 250/221, 222.1, 250/338.1, 338.3, 339.01, 559.19, 559.21, 559.22, 559.33, 208.2; 340/555, 556, 557

(56) References Cited

U.S. PATENT DOCUMENTS

| | | | | |
|---|---|---|---|---|
| 4,650,990 A | * | 3/1987 | Jonsson | ...................... 250/221 |
| 5,280,622 A | | 1/1994 | Tino | |
| 5,281,809 A | * | 1/1994 | Anderson et al. | ........... 250/221 |
| 6,166,371 A | | 12/2000 | Milbrath et al. | |

FOREIGN PATENT DOCUMENTS

| | | |
|---|---|---|
| EP | 0 598 630 A1 | 5/1994 |
| EP | 0 889 332 A1 | 1/1999 |
| JP | 10 289 939 | 10/1998 |
| JP | 11 024 750 | 1/1999 |

OTHER PUBLICATIONS

Ed Sherwood et al.: "Integrated Minienvironment Design Best Practices", *Technology Transfer #99033693A–ENG, International SEMATECH*, Mar. 31, 1999.

* cited by examiner

*Primary Examiner*—Kevin Pyo
(74) *Attorney, Agent, or Firm*—Laurence A. Greenberg; Werner H. Stemer; Ralph E. Locher

(57) ABSTRACT

A light curtain system is provided for establishing a protective light curtain for a tool in a system for processing objects such as wafers, and is particularly provided as a safety device for an operator of the tool. The light curtain system includes a first light curtain component of invisible light beams. A receiver and an emitter form edges of the protective light curtain from the invisible light beams. In addition, a second light curtain component of visible light beams is provided. The visible light beams are directed and transmitted adjacent and in parallel to the light beams of invisible light for forming a part of the protective light curtain and for making the protective light curtain visible for an operator. The second light curtain component of visible light beams is activated at least temporarily.

29 Claims, 1 Drawing Sheet

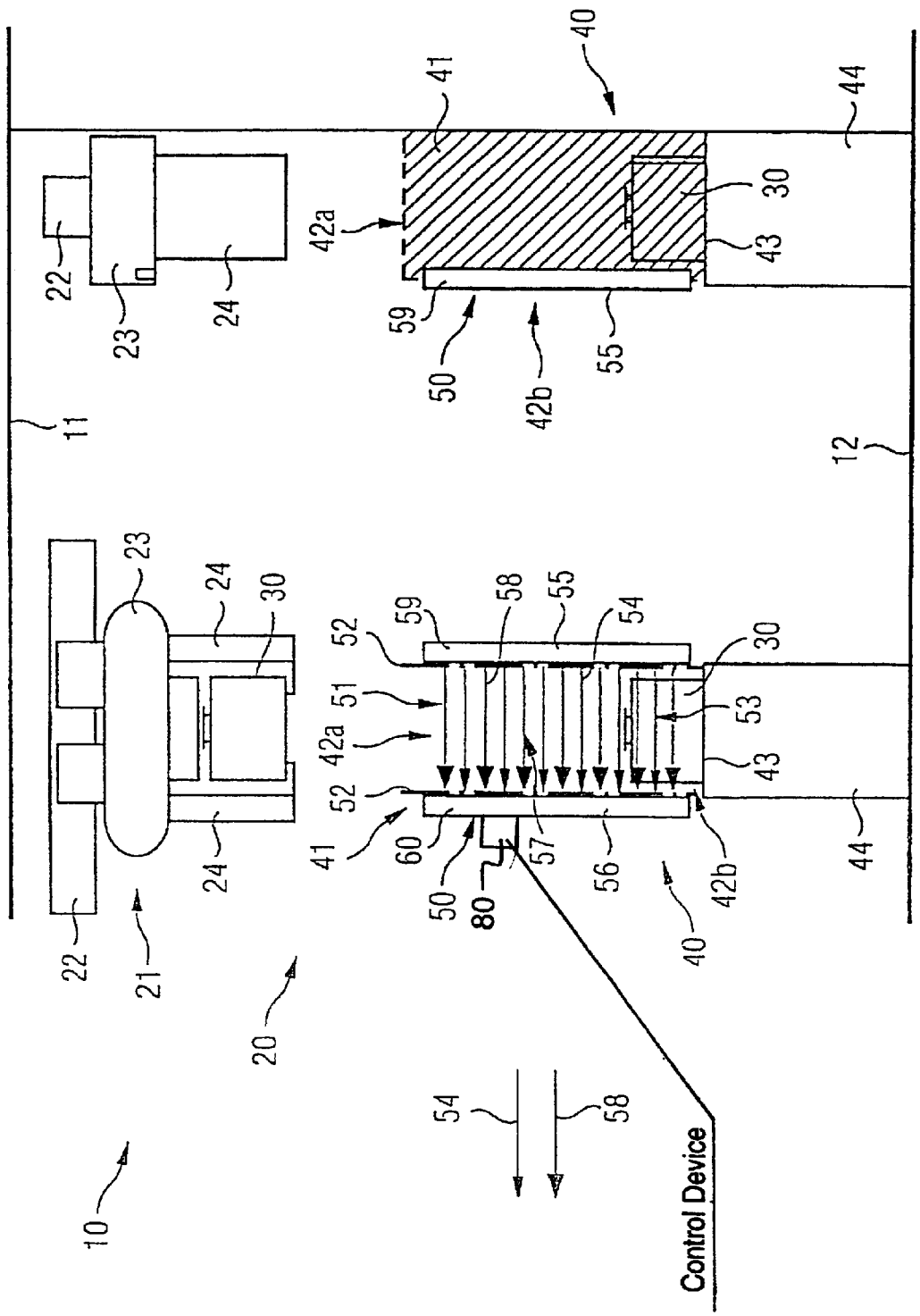

LIGHT CURTAIN SYSTEM FOR ESTABLISHING A PROTECTIVE LIGHT CURTAIN, TOOL AND SYSTEM FOR PROCESSING OBJECTS AND METHOD FOR LOADING/UNLOADING A TOOL

CROSS-REFERENCE TO RELATED APPLICATION

This application is a continuation of copending International Application No. PCT/EP00/12967, filed Dec. 19, 2000, which designated the United States and was published in English.

BACKGROUND OF THE INVENTION

Field of the Invention

The present invention generally relates to a light curtain system for establishing a protective light curtain for a tool. According to further aspects, the present invention relates to a tool and to a system for processing objects, particularly for processing disklike objects such as wafers, flat panels, CDs (Compact Discs) or the like. According to yet another aspect, the present invention relates to a method for loading and/or unloading a tool using an object in a system for processing objects.

For example, such systems, tools and methods can be used to manufacture semiconductor products.

In the technical field of manufacturing and processing wafers (for example silicon disks), flat panels or CDs in semiconductor industries it is common and necessary to move such objects between different locations such as processing stations, metrology stations or the like. Moreover, there is a need to store the objects in specific storage areas, when they are not needed at the moment or before they are moved to a next station.

Usually, such objects are stored and processed under mini-environment conditions. In light of the present invention, the term mini-environment defines a localized environment created by an enclosure to isolate a product from contamination and/or people. The requirements for such mini-environments are set forth in document "Integrated Mini-environment Design Best Practices", International SEMATECH, Technology Transfer #99033693A-ENG, SEMATECH Technology Transfer, 2706 Montopolis Drive, Austin, Tex. 78741, USA, http://www.sematech.org for example.

During transportation and any processing and storage steps or conditions, those objects are usually stored in special containers, for example, in so-called Front-Opening-Unified-Pods (FOUP).

In order to move such containers from one location to another location, they are usually carried by special vehicles that are moved along a system of tracks. The system of tracks can be mounted at the ceiling of an environment or fabrication, thus forming a so-called Overhead-Hoist-Transport-System (OHT).

When the objects reach a desired station—for example a processing station, a loading station or the like—via the transport system, they are lowered from the ceiling towards the station, where subsequently a processing step is performed. After finishing the processing step, the objects are picked up by the transport system, lifted to the ceiling of the environment and moved away from the station.

However, delivering and storing objects or containers (FOUPS) to process and/or metrology tools or the like in an automated fashion requires many safety implications for operators and material. Particularly in fabrications or pilot lines that are not fully automated, the delivery process includes both, automated steps—for example, an automated transportation by an OHT-system—and manual delivery by the operators. To protect the operators from being injured by an OHT delivery to a tool, for example, while lowering the objects from above the operator's eye level, a safety housing is typically provided around the tool. To allow automated loading as well as manual loading, the front of the safety housing is left open, thus forming a manual loadport. The manual loadport is equipped with a safety feature, for example a protective light curtain or a similar device.

Today's light curtain systems include an emitter and a receiver for infrared light beams, thus forming a protective light curtain of infrared light beams. Typically, the light curtain is activated throughout the entire operation time. Under predetermined circumstances, for example, when an object is lowered toward or lifted from a station, an interruption of the invisible light beams by an opaque object, for example by the arm of an operator, may cause an action, for example an action to stop the tool or the transport system.

However, since the protective light curtain is invisible for an operator, the operator could accidentally interrupt the protective light curtain. Present light curtain systems do not provide any mechanisms to prevent the protective light curtain from accidentally being interrupted.

Published European Patent Application EP 0 598 630 A shows a light curtain system including a first light curtain component of invisible light beams. The invisible light beams are emitted by an emitter and are directed and transmitted in parallel to each other towards a receiver. The receiver is adapted for receiving and detecting the presence or absence of the invisible light beams. The receiver is located spaced apart from the emitter, and the receiver and emitter form edges of the protective light curtain. In case one or more of the invisible light beams is/are blocked by the penetration of an opaque object, such as, the operator's arm or the like, a tool or system that is equipped with the light curtain system can be stopped.

The light curtain device known from Published European Patent Application EP 0 598 630 A further includes a number of indicator lights emitting visible light. These indicator lights are mounted adjacent to the beams of invisible light. Furthermore, a control unit is provided. The control unit operates to sense when one or more of the invisible light beams are blocked by the intrusion of an opaque object. The control unit operates indicator lights which are located adjacent the blocked beams. The visible light provides feedback to the operator, indicating where the protective light curtain is interrupted.

However, all solutions known from the prior art have several drawbacks. All solutions cannot prevent an operator from accidentally interrupting the protective light curtain that is plainly invisible. The solution according to Published European Patent Application EP 0 598 630 A only gives an indication, after the protective light curtain has already been interrupted.

For example, if those known solutions are used in the technical field of manufacturing and processing wafers as described above, an operator has no indication whether or not a loading operation is in progress. Therefore, he may accidentally interrupt the protective light curtain and thus trigger the action of stopping the manufacturing process.

Once, the conventional protective light curtain has triggered an emergency stop of the loading operation or tool operation, it takes precious time for the system to recover from this erroneous situation. The system has to be moved in slow motion back to its home position, and the system state and teach points have to be rechecked and so on. This is very time consuming.

SUMMARY OF THE INVENTION

It is an object of the present invention to provide a light curtain system for establishing a protective light curtain, a tool and a system for processing objects and a method for a loading/unloading a tool, which overcome the aforementioned drawbacks.

With the foregoing and other objects in view there is provided, in accordance with the invention, a light curtain system for establishing a protective light curtain for a tool. The light curtain system includes: a first receiver; and a first light curtain component including a first emitter for emitting invisible light beams. The invisible light beams are directed and transmitted in parallel with each other towards the first receiver. There is a second light curtain component providing visible light beams. The first receiver is adapted for receiving and detecting the presence and absence of the invisible light beams. The first receiver is located spaced apart from the first emitter. The first receiver and the first emitter define edges of the protective light curtain. The visible light beams form a part of the protective light curtain and are directed and transmitted adjacent and in parallel with the invisible light beams. The second light curtain component of the visible light beams is activated at least temporarily. The invisible light beams and the visible light beams are emitted alternately with respect to each other. At least one of the visible light beams is arranged between two of the invisible light beams.

The light curtain system includes as a first basic feature a first light curtain component. This component provides a protective light curtain consisting of invisible light beams. Additionally the light curtain system further includes a second light curtain component providing visible light beams. These visible light beams are directed and transmitted to run parallel to the invisible light beams and to form a part of the protective light curtain. The additional component of visible light beams creates the visual impression of a curtain.

From the existence of such visible light beams, an operator will get an explicit hint as to where the protective, but invisible light curtain is positioned. Since the operator knows the exact location of the protective light curtain, an accidental interruption of the light curtain can be prevented.

By enhancing a nonvisible light curtain by a visible light curtain element such actions can be avoided which otherwise would be triggered when the nonvisible curtain is interrupted—an emergency stop of a tool or of a transportation system for example.

Furthermore, the light curtain system can solve the problem of insufficient notification of operators, when a safety feature is active. Since the second light curtain component of visible light beams should be active at least temporary, it can for example get activated only in such situations in which the safety feature is activated.

As mentioned above, in the field of manufacturing semiconductor products operators often may not be aware that an automated loading operation to an equipment loadport is in progress. A component of visible light beams in the protective light curtain could be activated, when such a loading operation is in progress. Thus, the component of visible light gives an easy and relatively inexpensive indication of such an operation in progress. The operator can see at one glance that manual access to the loadport currently is not allowed. An example for such an application is described with respect to the inventive tool, system and method below.

The improved light curtain system can be used as a safety feature for any kind of tools and in any kind of systems.

Preferably, a control device is connected to the emitter and/or receiver for the invisible light beams and is adapted for processing signals received and detected by the receiver. Such a control device can be either provided as independent elements or can be integrated within the emitter and/or receiver. Such a control device is necessary to check, whether an interruption of the protective light curtain should trigger an action or not. This will be described in more detail with respect to the inventive system below.

In the same manner, other control devices can be provided, the other control device is connected to an emitter and/or a receiver for the visible light beams and is adapted for at least temporarily activating the second light curtain component of visible light beams.

The emitter for the invisible light beams can include one or more light emitting diodes (LEDs). Advantageously, the receiver for the invisible light beams can include one or more light sensing elements, particularly, one or more phototransistors, photoresistors or the like. However, the invention is not limited to any specific types of emitters or receivers.

The invisible light beams can preferably be infrared or near-infrared light beams.

The second light curtain component can advantageously include an emitter for the visible light beams. The emitter advantageously includes one or more light emitting diodes (LEDs) or one or more laser elements. The invention is not limited to specific types of emitters. Generally, any type of emitter can be used, which is capable of providing enough radiation energy to make the light visible under the prevailing environment conditions.

The second light curtain component may further include a receiver for the visible light beams, the receiver advantageously including one or more light sensing elements or a configuration of mirrors.

Since the visible light curtain component only functions as a device for indicating the actual location of the protective light curtain, any type of emitter and/or receiver for the visible light beams can be used that is/are capable of directing the visible light in such a direction that it appears to be part of the protective light curtain.

Preferably, the visible light beams can have a frequency in the range of colored light. In case that the invention is used in the field of semiconductor industries, the manufacture of such semiconductor products is usually performed in environments under clean room conditions. Under such conditions, the visible light beams can have a frequency in the range of yellow light or the like. Nevertheless, the present invention is not limited to special light-frequencies.

Advantageously, the emitter for the invisible light beams and/or the emitter for the visible light beams can be formed as an emitter-bar. According to another feature, the receiver for the invisible light beams and/or the receiver for the visible light beams can be formed as a receiver-bar. The formation in bar shape bears several advantages. As described above, the emitter(s) and/or receiver(s) form edges of the protective light curtain. By using bar shaped elements, the protective light curtain can, for example, be designed in rectangular shape, thus providing a unit that can easily be mounted within the loadport of a tool for processing objects.

The first light curtain component of invisible light beams can be adapted to function as an Interruption sensor. Under these circumstances, when one or more invisible light beams of the first light curtain component is/are blocked by an opaque object, for example, by the arm of an operator, the interruption of light beams will be detected by the respective receiver. These signals are processed within the control device thus creating interruption signals, which can trigger an action to the tool or system equipped with the light curtain system. Such an action could be an emergency stop, for example.

According to a second aspect of the present invention, a tool for processing objects, particularly for processing disklike objects such as wafers, flat panels, CDs or the like, is provided. The tool includes a safety housing having at least one loadport for loading or unloading the tool with an object. At least one loadport is provided with a light curtain system as described above.

Thus, the at least one loadport is protected by a protective light curtain. A second light curtain component provides visible light beams that create the visual impression of a curtain. However, the—now visible—light curtain does not mechanically obstruct the loadport in the safety housing. For further aspects, details, effects and advantages of the tool refer to the above description of the inventive light curtain system.

A tool that is equipped with such a light curtain system for establishing a protective light curtain increases the operator's safety, especially in the case of automated material handling or delivery, since the active safety feature (the protective light curtain) is plainly visible. Based on the visible protective light curtain, disadvantageous tool downtimes due to failed delivery operations by accidental light curtain interruptions can be minimized. Since the protective light curtain now has been made visible, the training procedures for the operators can be simplified.

The use of a tool having such a light curtain system could lead to an immense cost reduction.

The invention is not limited to specific kinds of objects which can be processed by the tools. Preferably, all sorts of objects can be processed, which have to be held under mini-environment or clean room conditions. The term "mini-environment" has already been explained in the introductory part of the description. Advantageously, the tool is used to process disklike objects such as wafers, for example, wafers with a diameter up to and beyond 300 mm. The tool can also process flat panels or CDs.

Also, the invention is not limited to specific kinds of tools. For example, the invention can be applied to every tool that is run in an automatic delivery mode such as an automated OHT delivery mode, because the operator interference represents a permanent risk with these tools.

In the light of the present invention, the term "tool" can include a processing tool and/or a metrology tool and/or a storage tool or the like. Furthermore, the term "tool" can also include any load station for one of the aforementioned tools. The invention is not limited to these specific examples.

According to a third aspect of the present invention, a system for processing objects, particularly for processing disklike objects such as wafers, flat panels, CDs or the like is provided. The system including an configuration for moving the objects through an environment, and one or more tools as described above for processing the objects. At least one of the tools includes a light curtain system as described above for establishing a protective light curtain for the tool.

With the foregoing and other objects in view there is provided, in accordance with the invention, a system for processing disklike objects. The system includes: a configuration for moving the objects through an environment; and a tool and a safety housing at least partially surrounding the tool. The safety housing includes at least one loadport for loading and unloading the objects. The loadport has a light curtain system for establishing a protective light curtain for the tool. The light curtain system includes: a first receiver, and a first light curtain component including a first emitter for emitting invisible light beams. The invisible light beams are directed and transmitted in parallel with each other towards the first receiver. There is a second light curtain component providing visible light beams. The first receiver is adapted for receiving and detecting the presence and absence of the invisible light beams. The first receiver is located spaced apart from the first emitter. The first receiver and the first emitter define edges of the protective light curtain. The visible light beams form a part of the protective light curtain and are directed and transmitted adjacent and in parallel with the invisible light beams. The second light curtain component of the visible light beams is activated at least temporarily. The invisible light beams and the visible light beams are emitted alternately with respect to each other. At least one of the visible light beams is arranged between two of the invisible light beams.

In such a system, an operator will be prevented from accidentally interrupting the protective light curtain. Additionally, the operator can get an indication, of when an automated loading/unloading operation of a tool of the system is in progress. For further details, effects, advantages, aspects, and for the function of the system, refer to the above described light curtain system as well as to the tool.

According to the system of the present invention, the second light curtain component of visible light is at least temporarily activated. This will be described with respect to a non limiting example. The second light curtain component can be activated just before a predetermined situation occurs and/or during such a situation. When an object to be processed is on its way to be delivered to a tool, for example, by an Overhead-Hoist-Transportation system, the component of visible light beams can be activated. Such a situation, which is about 10%–80% of the entire processing time, is a dangerous situation for a tool-operator, since he usually is not aware of an automated loading operation to the tool. The operation is normally in progress above the operator's eye level.

In such a situation, if the second light curtain component is activated, the operator gets a clear and direct indication that an object is on its way to the tool. During this time period he can stay away from the tool. For this reason, the possibility of getting injured is minimized.

Furthermore, the operator is prevented from accidentally interrupting the protective light curtain. Such an interruption could trigger the disadvantageous action of an emergency stop of the system. Once, the system has triggered such an emergency stop it would take a lot of time to recover the system, for example, to move the transport system back to its home position, to recheck the state and the teaching points of the system and so on. The proposed invention can save this time while maintaining the protective features of such solutions as known in the prior art.

Advantageously, the control device that is connected to the emitter and/or receiver for the invisible light beams can also be adapted for processing signals received from the configuration for moving objects. In a similar manner, the control device that is connected to the emitter and/or receiver for the visible light beams can also be adapted for processing signals received from the configuration for moving objects. This enables the safety features of the system, for example, the first light curtain component of invisible light beams and the second light curtain component of visible light beams to get activated with respect to the actual location of an object that has to be delivered to a tool using the configuration for moving objects. If the object approaches to the tool, the configuration will transmit its actual local position to the control device, which activate the safety features based on these signals.

The second light curtain component remains activated during the processing procedure within the tool and until the operation has been finished. Then, the visible light component is deactivated again. Now the operator has manual access to the tool without any risk.

Advantageously, the configuration for moving objects can be formed as an Overhead-Hoist-Transport (OHT) system. Such a system can preferably be used in the field of semiconductor manufacturing. As evident from the term "overhead", the system is mounted at the ceiling of an environment or a fabrication.

Such an OHT-system may include a system of tracks, the tracks being advantageously arranged at the ceiling of the environment. Preferably, two or more tracks are provided, the tracks forming the system of tracks.

Preferably, the configuration for moving objects may include one or more vehicles for transporting the objects to be moved.

By using a system of tracks, the vehicle(s) can be moved very easily to any desired location within the environment. In case of a semiconductor fabrication, for example, the vehicle(s) can be easily moved to a tool such as a processing station, a metrology station, a storage area, a loading station or the like. Advantageously, the system of tracks have one or more branching points.

According to the present invention, there is no need for a system of tracks with only one special configuration. The system of tracks can be adapted to the environment, for example, the fabrication where it is installed. The different tracks are arranged in such a manner that every desired location can be reached by the vehicle(s) carrying an object. Therefore, the system of tracks may include one or more of the above branching points, which connect the different tracks to become the system of tracks. In this case, the different tracks function as branches that lead to different locations. The number and configuration of the tracks and the branching points depends on the respective requirements.

The present invention is not limited to a specific number of vehicles, which can be moved through the environment along the tracks. In its basic configuration, the system can include at least one vehicle. However, it is also possible to use two or more vehicles.

When more than one vehicle is used, the system of tracks may include one or more bypass-tracks. The purpose of such bypass-tracks is to move two or more different vehicles past one another. In this case, the required number of tracks for moving more than one vehicle at the same time can be minimized.

Advantageously, the track or tracks is/are formed as an overhead track or overhead tracks. In this case, the track or tracks are preferably mounted at the ceiling of the environment. Therefore, the objects carried by the vehicle(s) of the system can be moved above the operators working in the different fabrication and processing locations and units. Thus, no obstructions with respect to the transportation of the objects between different locations can arise.

Preferably, the configuration for moving objects can be adapted for moving containers. The containers store the objects to be moved. Advantageously, the containers can be mini-environment containers, particularly, Front-Opening-Unified-Pods (FOUP). For example, such a container is defined in SEMI-Standards E44 and E62. The contents thereof are incorporated into the description of the present invention by reference with respect to the FOUPs. The containers can also be designed according to SEMI-Standard E47.1, the content of which is also incorporated by reference into the description of the present invention.

Advantageously, the system can be adapted for processing wafers with a diameter up to 300 mm or beyond.

Furthermore, the environment can have clean room conditions. Nevertheless, the invention can also be used in dirtier environments, especially, when objects, containers and tools with mini-environment conditions are used.

According to a fourth aspect of the present invention, a method for loading/unloading a tool—as described above— with objects in a system for processing objects—as described above—is provided. The method includes steps of: generating a first set of invisible light beams using the first light curtain component to establish a protective light curtain in the area of the loadport of the tool, and in predetermined situations, at least temporarily generating a second set of visible light beams using the second light curtain component. The visible light beams are directed and transmitted adjacent and in parallel to the invisible light beams for forming a part of the protective light curtain, thus making the protective light curtain visible for an operator.

By using the method, an operator will be prevented from accidentally interrupting a protective light curtain. Additionally, the operator can get a clear and direct indication, when an automated loading/unloading operation to a tool of the system is in progress. For further details, effects, advantages, aspects and for the function of the method it is also referred to the above described light curtain system as well as to the tool and the inventive system.

Preferably, the second light curtain component can be activated when an object is delivered to the tool and/or processed at the tool and/or moved away from the tool. Advantageously, the second light curtain component can be activated when an object is lowered to the tool or lifted from the tool by aid of the configuration for moving objects.

The second light curtain component can be deactivated, when the object is moved away from the tool.

The first light curtain component is activated preferably throughout the entire operation time of the system. The signals that are received and detected by the receiver of the first light curtain component and that are processed by the control device only trigger an action, if a predetermined situation arises. This predetermined situation can advantageously be when an object is delivered to a tool and/or processed at the tool and/or moved away from the tool.

With the present invention both product and operator safety will be improved. At the same time, the danger of product loss can be reduced.

Other features which are considered as characteristic for the invention are set forth in the appended claims.

Although the invention is illustrated and described herein as embodied in a light curtain system for establishing a protective light curtain, a tool, a system for processing objects, and a method for loading/unloading a tool, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows a schematic view of an inventive system for processing objects.

DESCRIPTION OF THE PREFERRED EMBODIMENTS

Referring now to the sole figure of the drawing in detail, there is shown a system for processing objects. The system is used in an environment 10 for manufacturing semiconductor products, such as, wafers with a diameter up to 300 mm or beyond, flat panels, CDs or the like. The environment 10 is held under clean room conditions.

The system 20 includes a configuration 21 for moving objects, which is—in the present embodiment—formed as an Overhead-Hoist-Transportation (OHT) system. The OHT-system 21 is mounted at the ceiling 11 of the environment 10. The attachment of OHT-System 21 at ceiling 11 can be accomplished in a known manner. Therefore, this attachment is not described in detail in the present embodiment.

OHT-system 21 includes a system of tracks 22, along which vehicles 23 can be moved. In the present embodiment, two vehicles 23 are illustrated. The system of tracks 22 can be formed in a manner which enables the vehicles 23 to be moved to any desired location within the environment 10.

In the present embodiment, vehicle 23 includes gripping devices 24 which are capable of holding containers 30 for storing objects. These containers 30 can be formed as so called Front-Opening-Unified-Pods (FOUPs). Within such a container 30, a number of disklike objects can be stored.

The containers 30 are moved along the system of tracks 22 through the environment 10 to different tools 40. In FIG. 1, only two tools 40 are illustrated. However, the invention is not limited to a special number of tools 40. For example, the tools 40 can be formed as processing tools that process the objects that are stored in the containers 30, as metrology tools, as storage tools for storing the objects or containers 30, and the like. The tools 40 can also be formed as so called loading stations for one of the aforementioned tools 40.

In the present embodiment shown in the figure, both tools 40 function as loading stations. Each loading station 40 includes a tool body 44. The tool body 44 is attached to the floor 12 of the environment 10. Furthermore, each loading station 40 is equipped with a support area 43 for storing containers 30. Each loading station 40 is surrounded by a safety housing 41 to protect an operator from being injured and to protect the stored containers 30 from being damaged.

Each loading station 40 includes two loadports 42a,b. One loadport 42a is provided at the top end of safety housing 41 thus enabling the OHT-system 21 to deliver a container 30 to the loading station 40 by lowering the container 30 from the top (from ceiling 11) towards the support area 43 of loading station 40. A second loadport 42b is provided in a wall of safety housing 41. The loadport 42b is arranged in the area of an operator's eye level. The loadport 42b allows manual access to the loading station 40 by the operator.

The loadport 42b is protected by a light curtain system 50. The light curtain system 50 is adapted for establishing a protective light curtain 51 for tool 40, and is particularly constructed as a safety device for the operator of the tool 40. The light curtain system 50 includes a first light curtain component 53 of invisible light beams 54, particularly infrared light beams.

The invisible light beams 54 are emitted by an emitter 55, which is formed as an emitter-bar having a number of light emitting diodes (LEDs). Those emitted invisible light beams 54 are directed and transmitted in parallel with each other towards a receiver 56. The receiver 56 is adapted for receiving and detecting the presence or absence of the invisible light beams 54. In the present embodiment, the receiver 56 is formed as a receiver-bar consisting of a number of phototransistors or photoresistors.

Receiver 56 is located spaced apart from the emitter 55. The receiver 56 and the emitter 55 form edges 52 of the protective light curtain 51.

The invisible light beams 54 created by the first light curtain component 53 create an invisible barrier, which can, if activated upon blocking one or more beams 54, trigger a predetermined action.

Light curtain system 50 further includes a second light curtain component 57 of visible light beams 58—in the present embodiment with a frequency in the range of yellow light. The visible light beams 58 are directed and transmitted adjacent and in parallel to the light beams 54 of invisible light. Thus, the visible light beams 58 form a part of the protective light curtain 51, thereby making the protective light curtain 51 visible for an operator. The second light curtain component 57 of visible light beams 58 is activated at least temporarily.

Those visible light beams 58 are created by an emitter 59, which is formed as an emitter-bar including a number of light emitting elements such as light emitting diodes (LEDs), laser elements or the like. The emitter 59 is disposed with respect to the emitter 55 such that those visible light beams 58, which create the visual impression of a curtain, indicate the actual location of those invisible light beams 54. Therefore, the emitter 59 can, for example, be disposed in parallel to the emitter 55 or in such a manner, that the invisible and the visible light beams are emitted alternately with respect to each other. For an easier understanding, the emitters 55 and 59 are indicated as a common element in the figure.

The second light curtain component 57 further includes a receiver 60 for the visible light beams. The receiver 60 is arranged, with regard to the receiver 56, in a similar manner as that described with respect the aforementioned emitters 55, 59. Since the receiver 60 only has to ensure that visible light beams 58 are transmitted in parallel to invisible light beams 54 and since the visible light beams 58 do not have any function with respect to activating or controlling actions of the system 20, receiver 60 could be provided as a configuration of mirrors.

A method for loading and/or unloading containers 30 in the system 20 for processing objects will now be described. When starting the system 20, the first light curtain component 53 of invisible light beams 54 is activated, and the component 53 remains activated throughout the entire operating time of the system 20. However, when one or more beams 54 are interrupted by an opaque object, such as, the arm of an operator, an action will only be triggered if a predetermined situation arises.

For example, a control device 80 that is connected to the emitter 55 and/or the receiver 56 can also be connected to OHT-system 21. In case a container 30 is in progress to be delivered to a tool 40 by vehicle 23, a respective signal from the OHT-system 21 can be transmitted to the control device 80. If an interruption of one or more invisible light beams 54 now occurs, a predetermined action can be triggered, for example, an emergency stopping of the tool 40 and/or of OHT-system 21. In this case, the operator can be protected from injuries. In case, no container 30 is in progress to be loaded or unloaded to/from loading station 40, the interruption of one or more invisible light beams 54 will cause no reaction of system 20.

Since the protective part of the protective light curtain 51 is formed of invisible light beams 54, an operator is not able to recognize the actual local position of the protective curtain 51. Therefore, he could accidentally interrupt one or more of the invisible light beams when a loading operation is in progress. This could easily occur, since the OHT-delivery operation usually takes place above operator's eye level.

In order to overcome the drawbacks, the second component 57 of visible light beams 58 is added to the light curtain component 53 of the invisible light beams 54. The second light curtain component 57 is only activated, when a predetermined situation occurs. This could be a situation, when an automated loading operation is in progress. When the object reaches the tool at which it shall be processed, the second light curtain component 57 of the visible light beams 58 is activated. Therefore, an operator of the tool 40 can see at one glance, if a loading/unloading operation is active and if a manual access to the tool is not permitted. After the operation at tool 40 has been finished, the second light curtain component 57 is deactivated again and the operator has allowed manual access to the tool 40.

We claim:

1. A light curtain system for establishing a protective light curtain for a tool, comprising:
    a first receiver;
    a first light curtain component including a first emitter for emitting invisible light beams, said invisible light beams being directed and transmitted in parallel with each other towards said first receiver; and
    a second light curtain component providing visible light beams;
    said first receiver being adapted for receiving and detecting the presence and absence of said invisible light beams;
    said first receiver being located spaced apart from said first emitter;
    said first receiver and said first emitter defining edges of said protective light curtain;
    said visible light beams forming a part of said protective light curtain and being directed and transmitted adjacent and in parallel with said invisible light beams;
    said second light curtain component being activated at least temporarily;
    said invisible light beams and said visible light beams being emitted alternately with respect to each other; and
    at least one of said visible light beams being arranged between two of said invisible light beams.

2. The light curtain system according to claim 1, comprising:
    a control device being adapted for processing signals received and detected by said first receiver;
    said control device being connected to a component selected from a group consisting of said first emitter and said first receiver.

3. The light curtain system according to claim 1, comprising:
    a second receiver for detecting said visible light beams; and
    a control device;
    said second light curtain component including a second emitter for emitting said visible light beams;
    said control device connected to a component selected from a group consisting of said second emitter and said second receiver; and
    said visible light beams having a frequency of colored light.

4. The light curtain system according to claim 1, wherein: said first emitter includes at least one light emitting diode.

5. The light curtain system according to claim 1, wherein: said first receiver includes at least one light sensing element.

6. The light curtain system according to claim 1, wherein: said first receiver includes at least one component selected from a group consisting of phototransistors and photoresistors.

7. The light curtain system according claim 1, wherein: said invisible light beams, emitted by said first emitter, are selected from a group consisting of infrared light beams and near-infrared light beams.

8. The light curtain system according claim 1, wherein: said second light emitting component includes a second emitter for emitting said visible light beams; and
    said second emitter includes at least one component selected from a group consisting of light emitting diodes and laser elements.

9. The light curtain system according claim 1, wherein: said second light curtain component includes a second receiver for receiving and detecting said visible light beams;
    said second receiver includes a component selected from a group consisting of a configuration of mirrors and at least one sensing element.

10. The light curtain system according claim 1, wherein: said visible light beams have a frequency of colored light.

11. The light curtain system according claim 1, wherein: said first emitter is formed as an emitter-bar.

12. The light curtain system according claim 1, wherein: said second light curtain component includes an emitter-bar for emitting said visible light beams.

13. The light curtain system according claim 1, wherein: said first receiver is formed as a receiver-bar.

14. The light curtain system according claim 1, comprising:
    a receiver-bar for receiving and detecting said visible light beams.

15. The light curtain system according to claim 1, wherein: said first light curtain component is adapted to function as an interruption sensor.

16. The light curtain system according to claim 1, wherein: said first light curtain component and said second light curtain component function as a safety device for an operator of the tool.

17. A tool configuration for processing disklike objects, comprising:
   a tool; and
   a safety housing at least partially surrounding said tool;
   said safety housing including at least one loadport for loading and unloading the objects;
   said at least one loadport having the light curtain system according to claim 1.

18. The tool configuration according to claim 17, wherein: said tool is selected from a group consisting of a processing tool, a metrology tool, and a storage tool.

19. The tool configuration according to claim 17, wherein: said tool is a loading station.

20. A system for processing disklike objects, comprising:
   a configuration for moving the objects through an environment; and
   a tool and a safety housing at least partially surrounding said tool;
   said safety housing including at least one loadport for loading and unloading the objects; and
   said at least one loadport having a light curtain system for establishing a protective light curtain for said tool, said light curtain system including:
      a first receiver,
      a first light curtain component including a first emitter for emitting invisible light beams, said invisible light beams being directed and transmitted in parallel with each other towards said first receiver, and
      a second light curtain component providing visible light beams,
      said first receiver being adapted for receiving and detecting the presence and absence of said invisible light beams,
      said first receiver being located spaced apart from said first emitter,
      said first receiver and said first emitter defining edges of said protective light curtain,
      said visible light beams forming a part of said protective light curtain and being directed and transmitted adjacent and in parallel with said invisible light beams,
      said second light curtain component being activated at least temporarily,
      said invisible light beams and said visible light beams being emitted alternately with respect to each other, and
      at least one of said visible light beams being arranged between two of said invisible light beams.

21. The system according to claim 20, comprising:
   a control device connected to a component selected from a group consisting of said first emitter and said first receiver;
   said control device also being adapted for processing signals received from said configuration for moving the objects.

22. The system according to claim 20, comprising:
   a control device;
   a second receiver for detecting said visible light beams;
   said second light curtain component including a second emitter for emitting said visible light beams;
   said control device being connected to a component selected from a group consisting of said second emitter and said second receiver;
   said control device also being adapted for processing signals received from said configuration for moving the objects.

23. The system according to claim 20, wherein: said configuration for moving the objects is formed as an Overhead-Hoist-Transport system.

24. The system according to claim 23, wherein: said Overhead-Hoist-Transport system includes a system of tracks, said tracks being configured at a ceiling of said environment.

25. The system according to claim 20, wherein: said configuration for moving the objects includes at least one vehicle for transporting the objects.

26. The system according to claim 20, in combination with containers for storing the objects, wherein: said configuration for moving the objects is adapted for moving said containers.

27. The system according to claim 20 wherein: said tool is adapted for processing wafers with a diameter up to 300 mm.

28. The system according to claim 20 wherein: said tool is adapted for processing wafers with a diameter greater than 300 mm.

29. The system according to claim 20, in combination with said environment, wherein: said environment has clean room conditions.

* * * * *